United States Patent [19]
Chung et al.

[11] Patent Number: 5,909,122
[45] Date of Patent: Jun. 1, 1999

[54] INTEGRATED CIRCUIT PACKAGE PIN MARKING SYSTEM

[76] Inventors: Robbie M. K. Chung, 348 Dolphin Isle, Foster City, Calif. 94404; Dario H. Impini, 36870 Papaya St., Newark, Calif. 94560

[21] Appl. No.: 08/768,267

[22] Filed: Dec. 17, 1996

[51] Int. Cl.[6] ........................................... G01R 31/02
[52] U.S. Cl. .................................. 324/758; 324/757
[58] Field of Search ............................ 324/765, 758, 324/754, 755, 158.1, 73.1, 757; 29/837, 592.01; 156/62, 64

[56] References Cited

U.S. PATENT DOCUMENTS 4,305,767  12/1981  Corey ............................... 156/62
5,051,870  9/1991  Companion ........................ 29/837
5,118,369  6/1992  Shamir .............................. 156/64

OTHER PUBLICATIONS

1993 Radio Shack catalog, p. 123. (unavailable month).

*Primary Examiner*—Vinh P. Nguyen
*Attorney, Agent, or Firm*—The Kline Law Firm

[57] ABSTRACT

An integrated circuit package pin marking system that includes marking indicia and probe guides. The marking indicia includes indicators on the surface of the IC package. The marking indicia will be applied to some or all of the pins, depending on the number of pins present. Additionally, the surface of the package includes holes or slots that are adapted to guide a probe to a selected pin. The pin marking system can be used with both through hole and surface mount IC devices.

4 Claims, 2 Drawing Sheets

INTEGRATED CIRCUIT PACKAGE PIN MARKING SYSTEM

FIELD OF THE INVENTION

The present invention relates generally to the integrated circuit industry, and more particularly is a means of marking the pins of an integrated circuit, and further to guide a metal probe to the appropriate pin while shielding the probe from adjacent pins.

BACKGROUND OF THE INVENTION

Electronic circuit boards utilizing a multitude of integrated circuit (IC) applications are manufactured in huge numbers worldwide. Each of the IC's, or chips, includes a large number of circuits that are accessed by metal leads, or pins. Because of the increasing circuit density of the chips, a growing problem with IC's is identifying the numerous pins and their corresponding circuits.

High pin density also leads to problems when assembling, testing, and/or troubleshooting the boards. To test individual circuits, a metal probe must be brought into contact with the appropriate pin. The greater the pin density, the more difficult it is to achieve contact with the desired pin, and to avoid contact with adjacent pins. It would thus be beneficial to have a means of guiding a probe to the desired pin.

There are several current art methods directed to the identification of the various pins on a chip. In some cases, individual pins of through hole circuit boards are identified with wire wrap tags on the bottom of the IC. While this system may be employed where the number of pins to be identified is small, the method becomes increasingly unworkable if a large number of pins is to be identified.

A more thorough method of pin identification is disclosed in U.S. Pat. No. 5,051,870, "Electronic Socket Attachment Method and Identification System", issued to John A. Companion, Sep. 24, 1991. The Companion technique envisions a matched set of adhesive labels. A first of the labels is affixed to the top surface of the chip, and a second mirror image label is affixed to lower surface. Additionally, a doublesided adhesive socket sticker is included with the identifying labels.

Clearly, the prior art methodology has technical shortcomings and/or is needlessly complex. Also, there is no convenient technique to establish a probe guide with the pin indicating means.

Accordingly, it is an object of the present invention to provide a simple, accurate means of pin identification on an IC package.

It is a further object of the present invention to provide a means of guiding a probe to a selected pin, and reducing the possibility of contact with an adjacent pin.

It is a still further object of the present invention to provide an identification means that is an integral part of the IC package.

SUMMARY OF THE INVENTION

The present invention is an integrated circuit package pin marking system that includes indicating means and that may include probe guides. The indicating means includes marking indicia on the top surface of the IC package. The indicating means will include labels for some or all of the pins, depending on the number of pins present. Additionally, the top surface of the package includes a hole or slot that is adapted to guide a probe to a selected pin. The pin indicating means can be used with both through hole and surface mount IC's.

An advantage of the present invention is that the indicating means is accurate, and the IC package is easily adapted to include the indicating means.

Another advantage of the present invention is that an integral probe guide is provided for a tester or debug operation.

A further advantage of the present invention is that the system may be installed during manufacturing of the IC package, or it can be installed by a purchaser of the package.

These and other objects and advantages of the present invention will become apparent to those skilled in the art in view of the description of the best presently known mode of carrying out the invention as described herein and as illustrated in the drawings.

DETAILED DESCRIPTION

Figure 1:
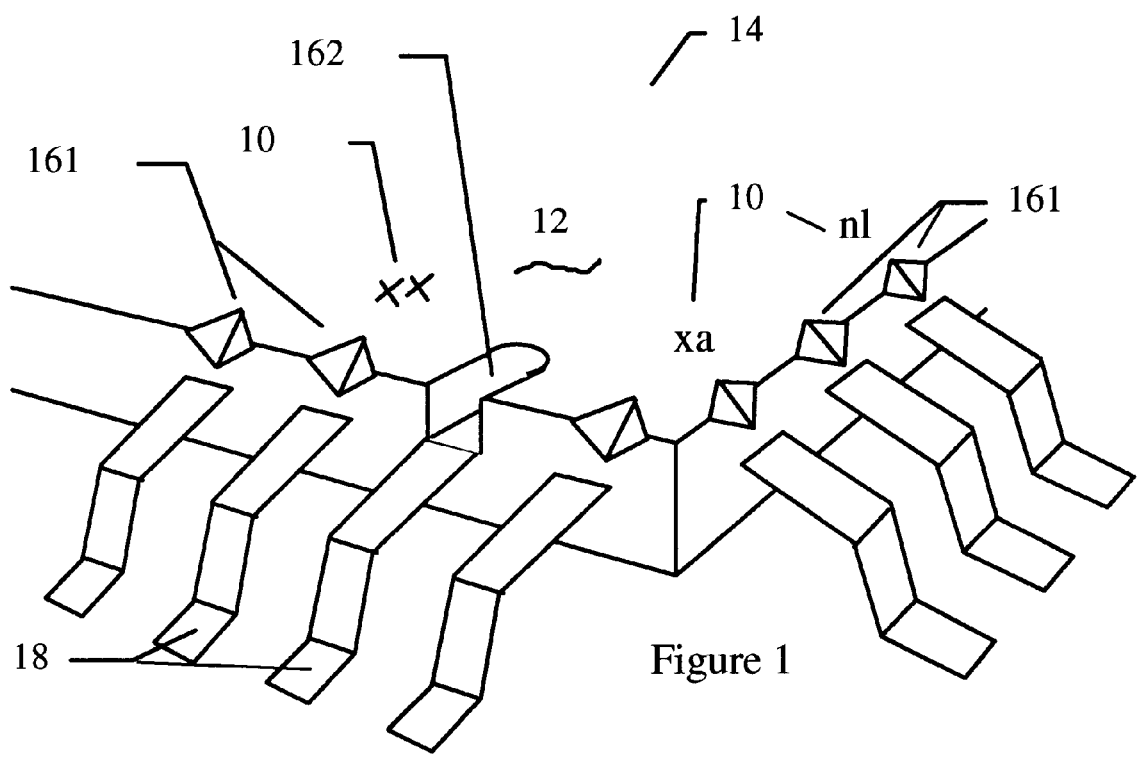
FIG. 1 is a partial top perspective view of an integrated circuit package with the pin indicating means and probe guides of the present invention.

The present invention is an integrated circuit package pin marking system. The system comprises chiefly indicia 10 printed directly onto an integrated circuit package 14. While the indicia 10 will generally be printed on a top surface 12 of IC package 14, the indicia could also be printed on a side surface, or on both top and side surfaces. The system includes probe guides.

The top surface 12 of the IC package 14 may be printed, via a silk-screening or similar process, with individual indicia 10 corresponding to each pin 18 of the IC 14. However, in order to reduce crowding on the top surface 12, only a selected number of the pins 18 will have labels when a large number of pins 18 are present.

The top surface 12 of the IC package 14 includes probe guide means that comprise a plurality of holes or slots that are situated in positions corresponding to the positions of the subject pins 18 of the IC device.

FIG. 1 illustrates two types of probe guides 16. The guides may be notches 161 that are cut or molded into the edge of the IC package 14. A user testing the circuit involving the subject pin 18 will lay his probe in the guide so that it makes electrical contact with the appropriate pin 18. The probe is guided to the proper pin, reducing the chance of testing an incorrect pin, or of contacting multiple pins simultaneously. In this way, testing and/or troubleshooting of the IC package 14 is greatly facilitated.

Also illustrated in FIG. 1 is a probe guide in the form of a channel 162 cut or molded into the top surface 12 of the IC package 14.

Figure 2:
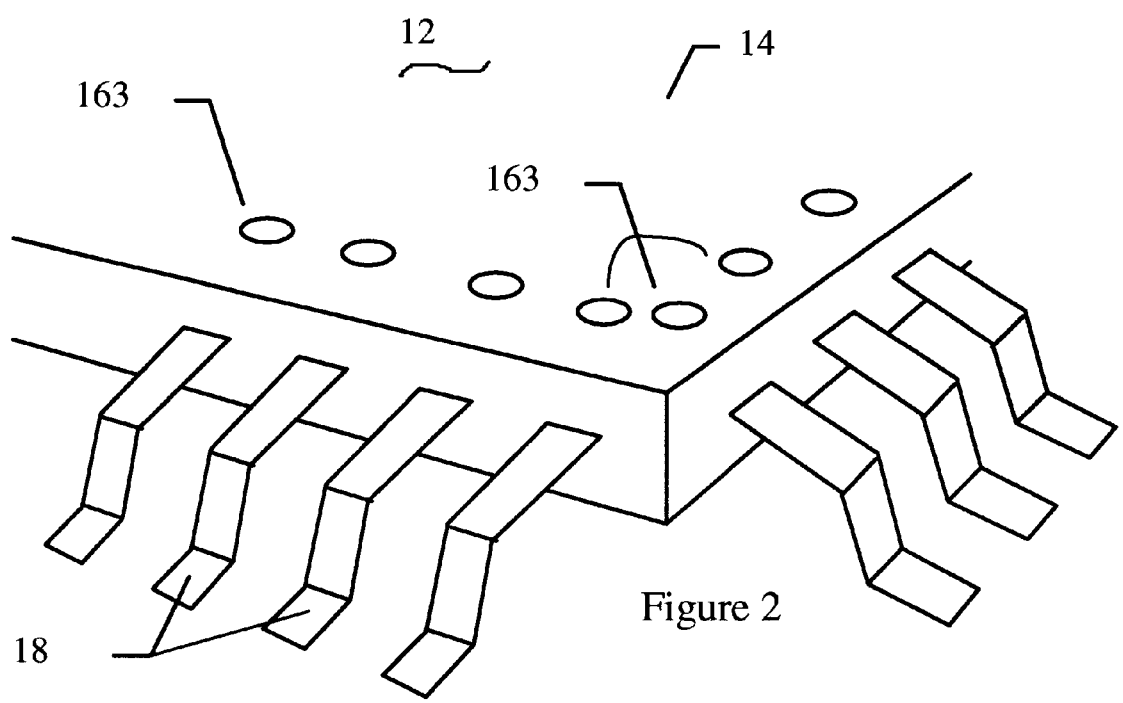
FIG. 2 is a partial top perspective view of an integrated circuit package with an alternate probe guide means.

FIG. 2 shows an alternate construction of the probe guides. Probe guides 163 are holes in the top surface 12 of the IC package 14. This construction adds further certainty to the placement of the user's probe by including a completely enclosed guide way to the pin 18.

The above disclosure is not intended as limiting. Those skilled in the art will readily observe that numerous modifications and alterations of the device may be made while retaining the teachings of the invention. Accordingly, the above disclosure should be construed as limited only by the restrictions of the appended claims.

We claim:

1. An integrated circuit package pin marking and probe guide system comprising:
   a plurality of indicia printed directly onto a surface of an integrated circuit package, a location of each said indicia corresponds to a location of one of a plurality of pins of said integrated circuit package, and
   a plurality of probe guides integral to said integrated circuit package, each of said probe guides comprises a means to at least partially contain a probe such that said probe is directed to make electrical contact with a subject pin of said integrated circuit package.

2. The pin marking system of claim 1 wherein:
   at least one said probe guides comprises a notch.

3. The pin marking system of claim 1 wherein:
   at least one of said probe guides comprises a channel in said surface of said integrated circuit package.

4. The pin marking system of claim 1 wherein:
   at least one each of said probe guides comprises a hole in said surface of said integrated circuit package.

* * * * *